United States Patent
Sel et al.

(10) Patent No.: US 8,329,574 B2
(45) Date of Patent: Dec. 11, 2012

(54) METHODS OF FABRICATING FLASH MEMORY DEVICES HAVING SHARED SUB ACTIVE REGIONS

(75) Inventors: Jong-Sun Sel, Yongin-si (KR); Jung-Dal Choi, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/230,978

(22) Filed: Sep. 13, 2011

(65) Prior Publication Data

US 2011/0318902 A1    Dec. 29, 2011

Related U.S. Application Data

(60) Continuation of application No. 12/725,936, filed on Mar. 17, 2010, now Pat. No. 8,021,978, which is a division of application No. 11/376,371, filed on Mar. 15, 2006, now Pat. No. 7,723,776.

(30) Foreign Application Priority Data

Oct. 4, 2005 (KR) .................. 10-2005-0093131

(51) Int. Cl.
*H01L 21/44* (2006.01)
(52) U.S. Cl. ........ 438/637; 438/257; 438/598; 438/672; 257/E29.112; 257/E29.02
(58) Field of Classification Search .......... 257/315, 257/316, 326, 395–397, 905, E29.112, E29.02; 438/201, 211, 257, 598, 599, 618, 637, 672
See application file for complete search history.

(56) References Cited

U.S. PATENT DOCUMENTS

| | | | |
|---|---|---|---|
| 4,962,481 A | 10/1990 | Choi et al. | |
| 5,812,452 A | 9/1998 | Hoang | |
| 6,151,249 A | 11/2000 | Shirota et al. | |
| 6,169,313 B1 | 1/2001 | Tsutsumi et al. | |
| 6,429,476 B2 | 8/2002 | Suzuki et al. | |
| 6,483,136 B1 | 11/2002 | Yoshida et al. | |
| 6,593,190 B2 | 7/2003 | Lee et al. | |
| 6,635,532 B2 | 10/2003 | Song et al. | |
| 7,313,026 B2 | 12/2007 | Shiba et al. | |

FOREIGN PATENT DOCUMENTS

| | | |
|---|---|---|
| EP | 1 014 448 A2 | 6/2000 |
| JP | 6-275800 A | 9/1994 |
| JP | 2000-196046 A | 7/2000 |
| KR | 10-1994-0001402 | 2/1994 |
| KR | 10-2002-0062435 A | 7/2002 |
| KR | 2002-0067776 A | 8/2002 |
| KR | 10-2002-0073783 A | 9/2002 |
| KR | 10-2004-0063350 A | 7/2004 |

OTHER PUBLICATIONS

Notice of Allowability, KR 10-2005-0093131, May 22, 2007.

*Primary Examiner* — Matthew E Warren
(74) *Attorney, Agent, or Firm* — Myers Bigel Sibley & Sajovec, P.A.

(57) ABSTRACT

Flash memory devices include a pair of elongated, closely spaced-apart main active regions in a substrate. A sub active region is also provided in the substrate, extending between the pair of elongated, closely spaced-apart main active regions. A bit line contact plug is provided on, and electrically contacting, the sub active region and being at least as wide as the sub active region. An elongated bit line is provided on, and electrically contacting, the bit line contact plug remote from the sub active region.

15 Claims, 11 Drawing Sheets

METHODS OF FABRICATING FLASH MEMORY DEVICES HAVING SHARED SUB ACTIVE REGIONS

CROSS-REFERENCE TO RELATED APPLICATIONS

This application is a continuation of U.S. application Ser. No. 12/725,936, filed Mar. 17, 2010, now U.S. Pat. No. 8,021,978 entitled Methods of Fabricating Flash Memory Devices Having Shared Sub Active Regions, which itself is a divisional of U.S. application Ser. No. 11/376,371, filed Mar. 15, 2006, now U.S. Pat. No. 7,723,776 entitled Flash Memory Devices Having Shared Sub Active Regions, which itself claims the priority of Korean Patent Application No. 10-2005-0093131, filed on Oct. 4, 2005, in the Korean Intellectual Property Office, the disclosures of all of which are incorporated herein in their entirety by reference.

FIELD OF THE INVENTION

The present invention relates to memory devices and associated fabrication methods, and more particularly, to flash memory devices and associated fabrication methods.

BACKGROUND OF THE INVENTION

Integrated circuit memory devices used for storing data can be divided into volatile memory devices or non-volatile memory devices. When the electric power supplied to the volatile memory devices is interrupted, the volatile memory devices lose data stored in the devices. However, even though the electric power supplied to non-volatile memory devices is interrupted, the non-volatile memory devices keep data stored in the devices. Thus, the non-volatile memory devices, for example, flash memory devices, may be used for memory cards, mobile communication terminals and many other applications.

FIG. 1 is a plan view illustrating a portion of a cell array region of a conventional NAND-type flash memory device.

With reference to FIG. 1, an isolation layer to define a plurality of line shaped active regions 1 is formed at a predetermined region of the cell array region. A string selection line SSL' and a ground selection line GSL' are formed to cross over the active regions 1. The string selection line SSL' and the ground selection line GSL' are disposed in parallel with each other and closely spaced-apart from each other. A plurality of control gate electrodes WL1', . . . , WLn', that is, n word lines WL1', . . . , WLn', are provided to cross over the active regions 1 between the string selection line SSL' and the ground selection line GSL'. A plurality of floating gates 5 are interposed between the control gate electrodes WL1', . . . , WLn' and the active regions 1. An insulating interlayer is provided on the substrate including the control gate electrodes WL1', . . . , WLn'. Bit line contact holes 15 penetrating the insulating interlayer, and bit line contact plugs filling the bit line contact holes 15, are provided. Bit lines 20 covering the bit line contact plugs and overlapping the active regions 1 are provided.

When the integration density of the conventional NAND-type flash memory device of FIG. 1 increases, the pitch of the bit lines 20 and the active regions 1 generally decreases. Nevertheless, the bit lines 20 should have low electrical resistance to allow high speed operation of the NAND-type flash memory device.

To solve the problems due to the decrease in the pitch of the bit lines 20, NAND-type flash memory devices have been suggested, wherein four adjacent strings share one bit line. A NAND-type flash memory device having a shared bit line is disclosed in U.S. Pat. No. 6,151,249 to Shirota et al. As described in this patent, first and second active regions adjacent to each other are formed in a semiconductor substrate, and predetermined regions of the first and second active regions are contacted with one bit line contact plug. Unfortunately, it may be difficult to provide low contact resistance between the bit line contact plug and the active regions.

SUMMARY OF THE INVENTION

Flash memory devices according to some embodiments of the present invention include a substrate and a pair of elongated, closely spaced-apart main active regions in the substrate. A sub active region is also provided in the substrate, extending between the pair of elongated, closely spaced-apart main active regions. A bit line contact plug is provided on, and electrically contacting, the sub active region and being at least as wide as the sub active region. An elongated bit line is provided on, and electrically contacting, the bit line contact plug remote from the sub active region. The elongated bit line extends between the pair of elongated, closely spaced-apart main active regions, and may also overlap the pair of elongated, closely spaced-apart main active regions. A plurality of flash memories cells are provided in the pair of elongated, closely spaced-apart main active regions. Moreover, in some embodiments, the sub active region includes a contact impurity region adjacent the bit line contact plug, the flash memory cells include source/drain regions, and the contact impurity region extends deeper into the substrate than the source/drain regions.

Flash memory devices according to other embodiments of the invention comprise an isolation layer in a semiconductor substrate, that defines active regions. The active regions include a pair of closely spaced-apart main active regions in parallel with each other and a sub active region, interposed between the main active regions, that connect to the main active regions. The sub active region has a first width. At least one selection line crosses over the main active regions and is disposed adjacent to the sub active region. A bit line contact plug contacts the sub active region, and has a second width which is at least as wide as (i.e., the same as or greater than) the first width. A shared bit line contacts the bit line contact plug remote from the sub active region.

Source/drain regions may be provided in the main active regions of both sides of the selection line.

A contact impurity region may be provided in the sub active region in contact with the bit line contact plug. The contact impurity region may be deeper (i.e., extend deeper into the substrate) than the source/drain regions.

The contact impurity region may have a greater impurity concentration than that of the source/drain regions.

A distance between the sub active region and the selection line may be at least as large as (i.e., the same as or greater than) a distance between the bit line contact plug and the selection line.

A distance between the sub active region and the selection line may be greater than the first width.

When the second width is greater than the first width, the bit line contact plug may be provided to extend beyond at least one sidewall of the sub active region.

The bit line contact plug may be a doped semiconductor plug and/or a metal plug.

In accordance with other exemplary embodiments, NAND-type flash memory devices are provided. The NAND-type flash memory devices comprise an isolation layer in a semiconductor substrate, that defines active regions. The active regions include a pair of closely spaced-apart main active regions in parallel with each other and a sub active region, interposed between the main active regions, that connects to the main active regions. The sub active region has a first width. Selection lines cross over the main active regions. The selection lines include at least one string selection line adjacent to the sub active region, and a ground selection line adjacent to the string selection line and remote from the sub active region. A plurality of control gate electrodes cross over the main active regions between the string selection line and the ground selection line. An insulating interlayer is provided on the substrate having the selection lines and the control gate electrodes. A bit line contact plug penetrates the insulating interlayer to contact the sub active region. The bit line contact plug has a second width which is the same as or greater than the first width. A shared bit line is arranged to contact the bit line contact plug on the insulating interlayer.

Floating gates may be interposed between the main active regions and the control gate electrodes.

Tunnel insulating layers may be interposed between the main active regions and the floating gates. Inter-gate dielectric layers may be interposed between the floating gates and the control gate electrodes.

Source/drain regions may be provided in the main active regions of both sides of the selection lines and on both sides of the control gate electrodes.

A contact impurity region may be interposed in the sub active region in contact with the bit line contact plug. The contact impurity region may be deeper than the source/drain regions.

The contact impurity region may have a greater impurity concentration than that of the source/drain regions.

A distance between the sub active region and the string selection line may be the same as or greater than a distance between the bit line contact plug and the string selection line.

A distance between the sub active region and the string selection line may be greater than the first width.

When the second width is greater than the first width, the bit line contact plug may cover at least one sidewall of the sub active region.

The bit line contact plug may be a doped semiconductor plug and/or a metal plug.

Methods of fabricating NAND-type flash memory devices according to some embodiments of the invention form an isolation layer in a semiconductor substrate. The isolation layer defines a pair of closely spaced-apart main active regions in parallel with each other and a sub active region, interposed between the main active regions, to connect the main active regions. The sub active region is formed to have a first width. Selection lines, including at least one string selection line and a ground selection line, are formed to cross over the main active regions, and a plurality of stacked gate patterns are formed between the string selection line and the ground selection line. The string selection line is formed adjacent to the sub active region. The stacked gate patterns are formed to have control gate electrodes crossing over the main active regions and floating gates interposed between the control gate electrodes and the main active regions. An insulating interlayer is formed on the substrate having the selection lines and the stacked gate patterns. A bit line contact hole is formed to expose the sub active region by patterning the interlayer insulating layer. The bit line contact hole is formed to have a second width which is the same as or greater than the first width. A bit line contact plug is formed in the bit line contact hole. A shared bit line is formed on the bit line contact plug and on the insulating interlayer.

Prior to the forming of the insulating interlayer, source/drain regions may be formed in the main active regions between the selection lines and the stacked gate patterns.

Prior to the forming of the bit line contact plug, a contact impurity region may be formed in the sub active region exposed by the bit line contact hole, by implanting impurities.

When the second width is greater than the first width, during forming of the bit line contact hole, the isolation layer adjacent to the sub active region may be recessed to expose at least one sidewall of the sub active region.

DETAILED DESCRIPTION

Figure 1:
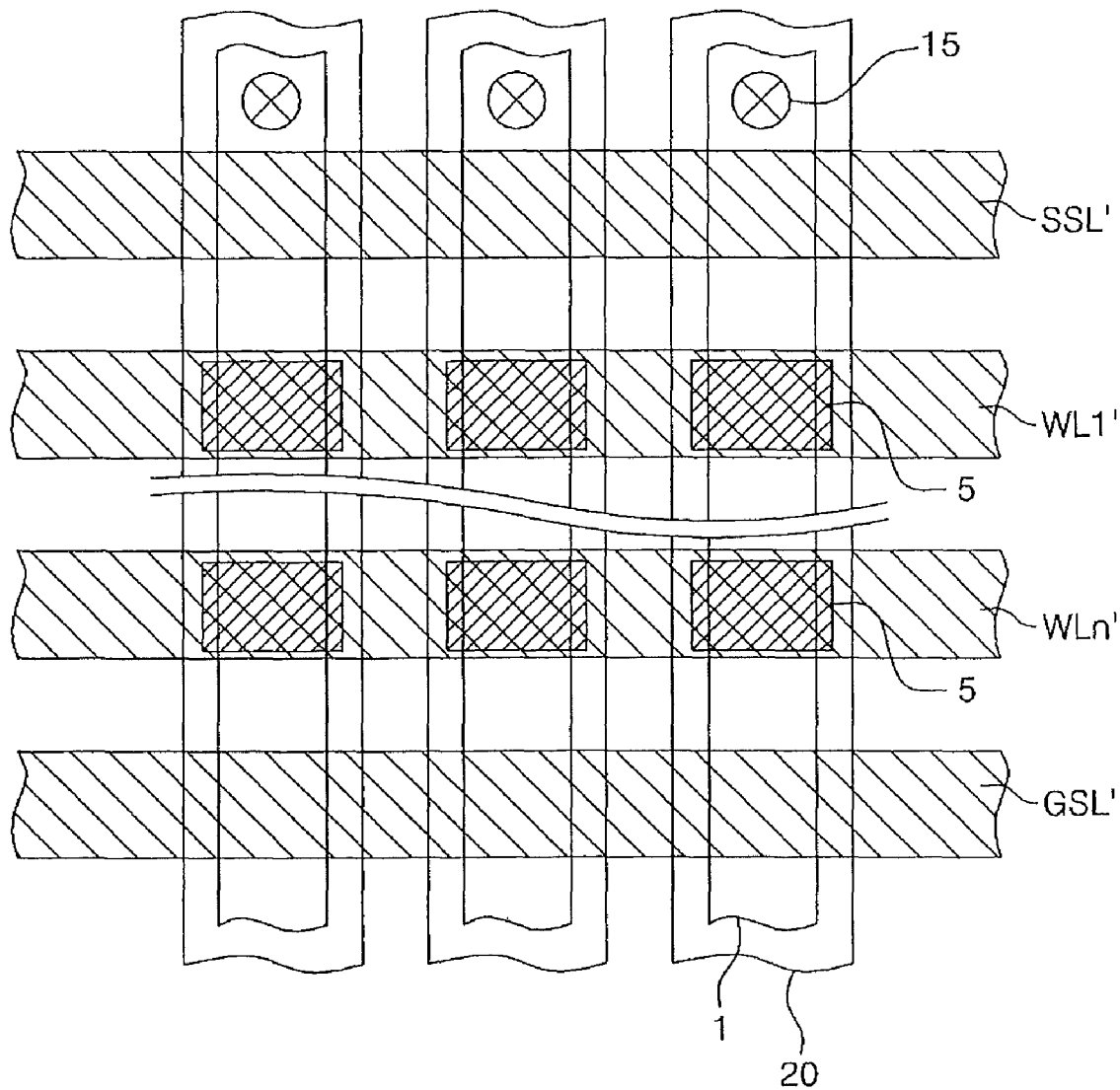
FIG. 1 is a plan view illustrating a portion of a cell array region in the conventional flash memory device.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity unless express so defined herein. Moreover, each embodiment described and illustrated herein includes its complementary conductivity type embodiment as well. Like numbers refer to like elements throughout.

It will be understood that when an element or layer is referred to as being "on", "contacting", "connected to" and/or "coupled to" another element or layer, it can be directly on, connected or coupled to the other element or layer or intervening elements or layers may be present. In contrast, when an element is referred to as being "directly on," "directly contacting", "directly connected to" and/or "directly coupled to" another element or layer, there are no intervening elements or layers present. As used herein, the term "and/or" may include any and all combinations of one or more of the associated listed items and may be abbreviated by "/".

It will be understood that, although the terms first, second, third, etc., may be used herein to describe various elements, components, regions, layers and/or sections, these elements, components, regions, layers and/or sections should not be limited by these terms. These terms may be used to distinguish one element, component, region, layer and/or section from another region, layer and/or section. For example, a first element, component, region, layer and/or section discussed below could be termed a second element, component, region, layer and/or section without departing from the teachings of the present invention.

Spatially relative terms, such as "beneath", "below", "lower", "above", "upper" and the like, may be used herein for ease of description to describe an element and/or a feature's relationship to another element(s) and/or feature(s) as illustrated in the figures. It will be understood that the spatially relative terms are intended to encompass different orientations of the device in use or operation in addition to the orientation depicted in the figures. For example, if the device in the figures is turned over, elements described as "below" and/or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a", "an" and "the" are intended to include the plural forms as well, unless the context clearly indicates otherwise. It will be further understood that the terms "comprises," "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover, fewer or greater numbers of active regions, sub active regions, string selection lines, word lines, ground lines, contact plugs and/or flash memory cells may be provided compared to those that are illustrated herein.

Example embodiments of the invention are described herein with reference to plan and/or cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
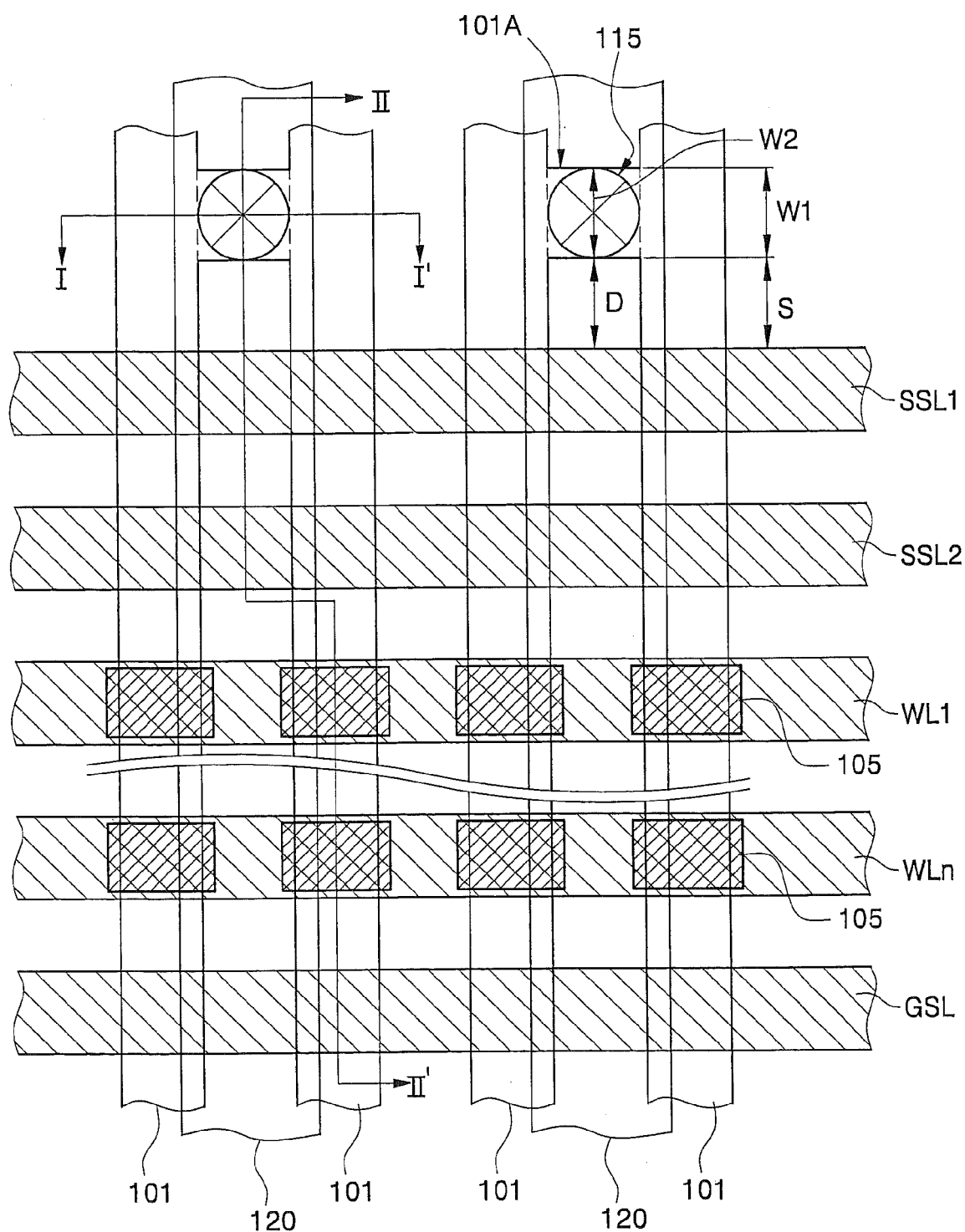
FIG. 2 is a plan view illustrating a portion of a cell array region in a NAND-type flash memory device according to some embodiments of the present invention.
Figure 3:
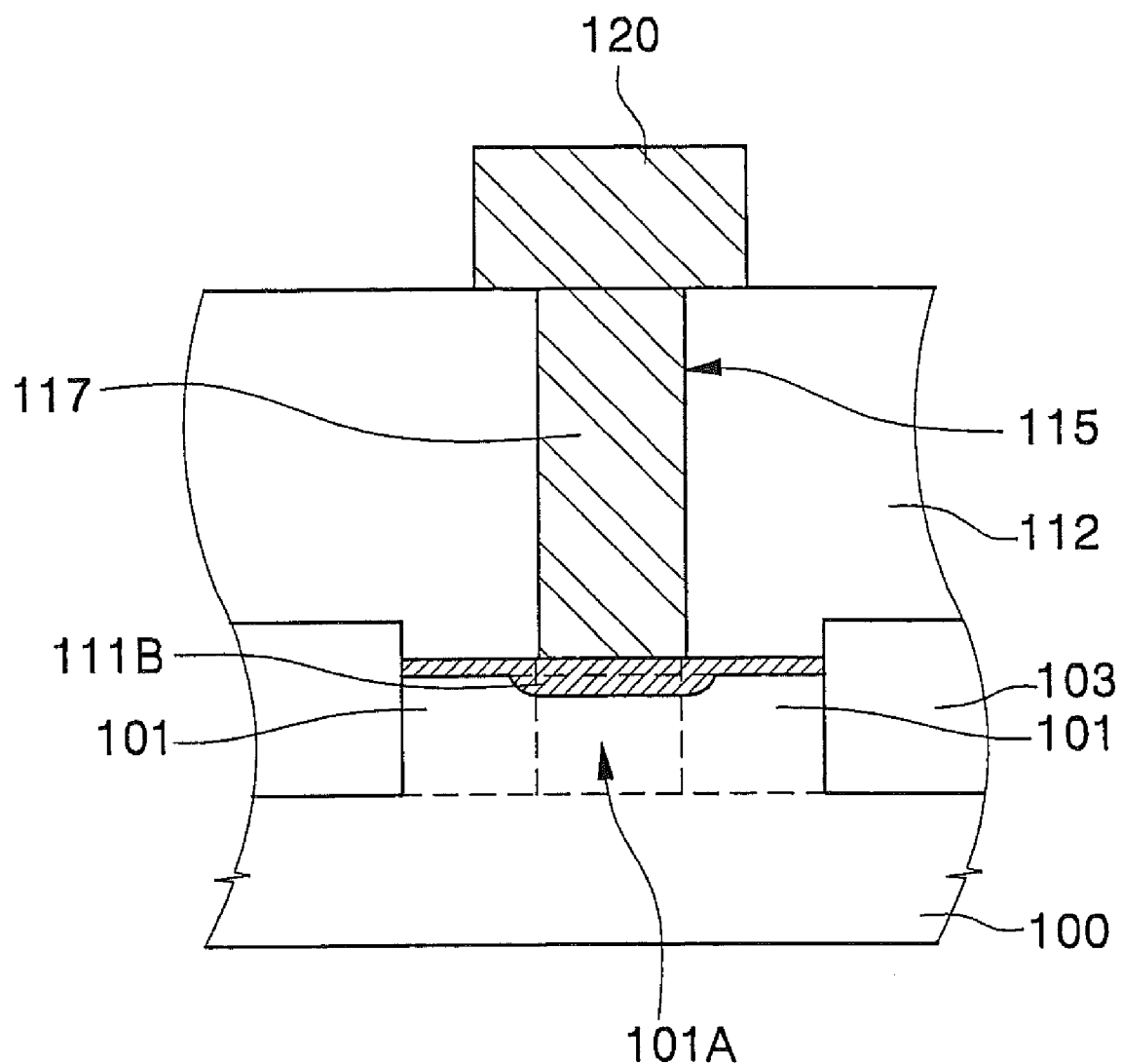
FIG. 3 is a sectional view illustrating a NAND-type flash memory device according to some embodiments of the present invention, as taken along the line I-I' of FIG. 2.
Figure 4:
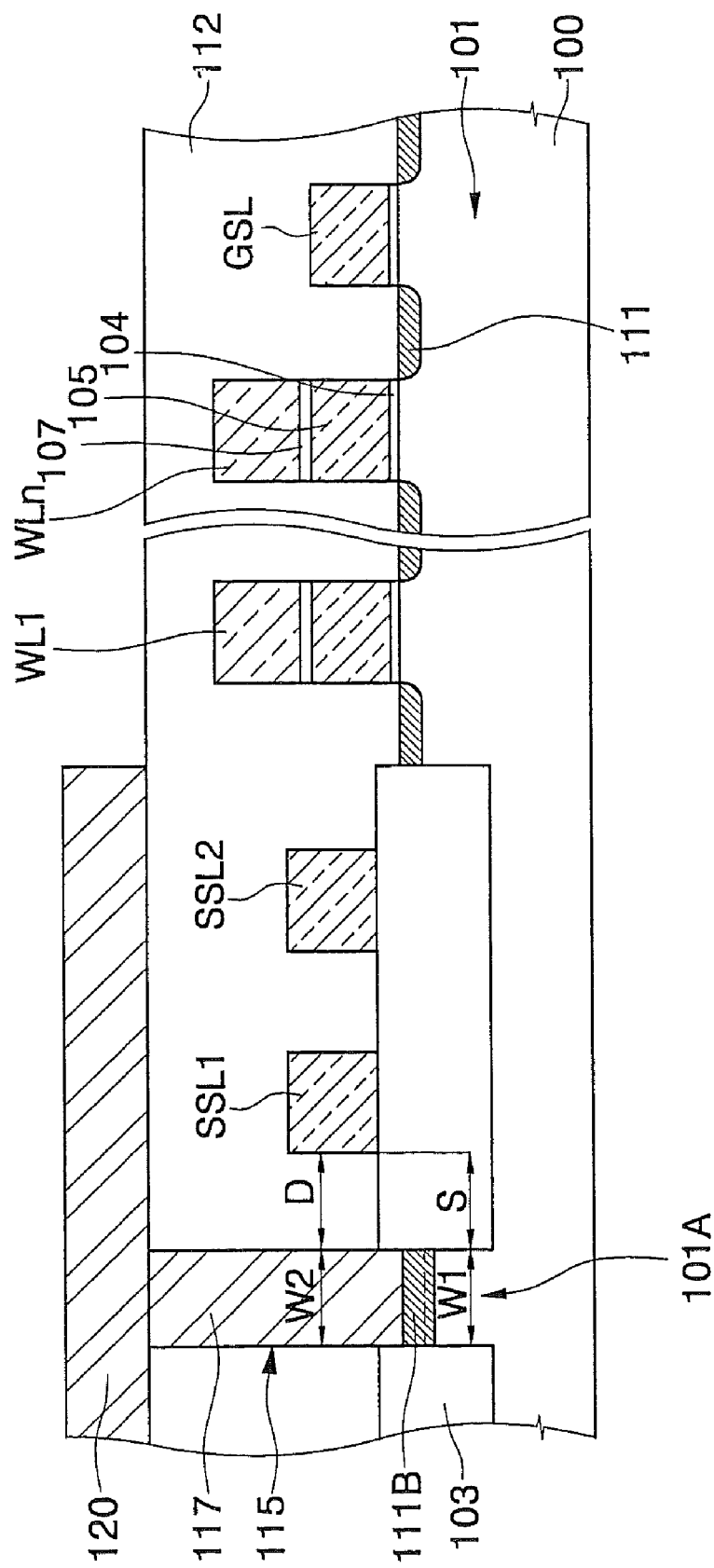
FIG. 4 is a sectional view illustrating a NAND-type flash memory device according to some embodiments of the present invention, as taken along the line II-II' of FIG. 2.

FIG. 2 is a plan view illustrating a portion of a cell array region of a NAND-type flash memory device according to some embodiments of the present invention, FIG. 3 is a sectional view taken along the line I-I' of FIG. 2 to explain NAND-type flash memory devices according to some embodiments of the present invention. FIG. 4 is a sectional view taken along the line II-II' of FIG. 2 to explain NAND-type flash memory devices according to some embodiments of the present invention.

With reference to FIGS. 2 through 4, an isolation layer 103 is provided at a predetermined region of a semiconductor substrate 100, such as a monocrystalline, single element and/or compound semiconductor substrate and/or a semiconductor-on-insulator substrate. The isolation layer 103 may be an insulating layer filling a trench region formed in the substrate 100. The isolation layer 103 defines at least a pair of closely spaced-apart main active regions 101 which are generally parallel with each other and a sub active region 101A, interposed between the pair of main active regions 101, that connects the main active regions 101. The sub active region 101A has a first width W1. String selection lines and a ground selection line GSL can be provided to cross over the main active regions 101. The string selection lines can be adjacent to one side of the sub active region 101A. The string selection lines can include a first string selection line SSL1 and a second string selection line SSL2 which are positioned adjacent and closely spaced-apart from to each other. The first string selection line SSL1, the second string selection line SSL2 and the ground selection line GSL can be further symmetrically provided at the other side of the sub active region 101A. The first string selection line SSL1, the second string selection line SSL2 and the ground selection line GSL can be positioned generally in parallel with one another as shown in the plan view of FIG. 2. The ground selection line GSL can be positioned spaced-apart from the second string selection line SSL2.

N control gate electrodes WL1, . . . , WLn, that is, n word lines WL1, . . . , WLn, crossing over the main active regions 101 between the second string selection line SSL2 and the ground selection line GSL1 are provided. A plurality of floating gates 105 are interposed between the control gate electrodes WL1, . . . , WLn and the main active regions 101. The floating gates 105 can be two-dimensionally arranged at the point where the main active regions 101 and the control gate electrodes WL1, . . . , WLn intersect, respectively. The floating gates 105 are insulated from the main active regions 101 by tunnel insulating layers 104, respectively. Inter-gate dielectric layers 107 can be interposed between the floating gates 105 and the control gate electrodes WL1, . . . , WLn. Each floating gate 105 may play a role of a charge storage layer and may be made of, for example, polysilicon and/or silicon nitride. Source/drain regions 111 can be provided in the main active regions 101 between the first string selection line SSL1, the second string selection line SSL2, the ground selection line GSL and the control gate electrodes WL1, . . . , WLn.

An insulating interlayer 112 having a bit line contact hole 115 is provided on the substrate having the first string selection line SSL1, the second string selection line SSL2, the ground selection line GSL and the control gate electrodes WL1, . . . , WLn. The insulating interlayer 112 can be a silicon oxide layer. A bit line contact plug 117 is provided in, and in some embodiments to fill, the bit line contact hole 115. The bit line contact plug 117 may be a doped semiconductor plug and/or a metal plug. For example, the bit line contact plug 117 may be a doped polysilicon plug or a tungsten plug. The bit line contact plug 117 contacts the sub active region 101A exposed by the bit line contact hole 115. The bit line contact plug 117 may have a second width W2 which is the same as the first width W1 of the sub active region, as shown in FIG. 4. Then, a distance S between the sub active region 101A and the first string selection line SSL1 may be the same as a distance D between the bit line contact plug 117 and the first string selection line SSL1. In addition, the first width W1 may be less than the distance S between the sub active region 101A and the first string selection line SSL1.

In the embodiments of FIGS. 2 through 4, the distance S may be determined in consideration of the limited resolution of a photolithography process to define the main active regions 100 and the sub active region 101A, and the alignment margin between the sub active region 101A and the first string selection line SSL1. Specifically, even though a first photolithography process to define the active regions 101 and 101A, and a second photolithography process to form the first string selection line SSL1 proceed in the worst case condition within a permissible range, the distance S has sufficient size such that the first string selection line SSL1 does not overlap the sub active region 101A. In this case, the integration density of the flash memory device according to some embodiments of the present invention may decrease. However, according to some embodiments of the present invention, the sub active region 101A has the same width as the bit line contact plug 117. Thus, it is possible to compensate for the decrease in integration density of the flash memory device, caused by the increase in the distance S, by reducing the area of the sub active region 101A.

A contact impurity region 111B may be provided in the sub active region 101A in contact with the bit line contact plug 117. In order to provide ohmic contact of the bit line contact plug 117 and the sub active region 101A, the contact impurity region 111B may be an impurity region having the same conductivity type as the source/drain regions 111, e.g., n-type impurity region. The contact impurity region 111B may be deeper (i.e., extend deeper into the substrate 100) than the source/drain region 111. In addition, the contact impurity region 111B may have a higher impurity concentration than the source/drain region 111. A shared bit line 120 extending on, and in some embodiments covering, the bit line contact plug 117 is provided on the interlayer insulating layer 112. The shared bit line 120 may be disposed in parallel with and between the main active regions 101, and may partially overlap the main active regions 101.

Figure 5:
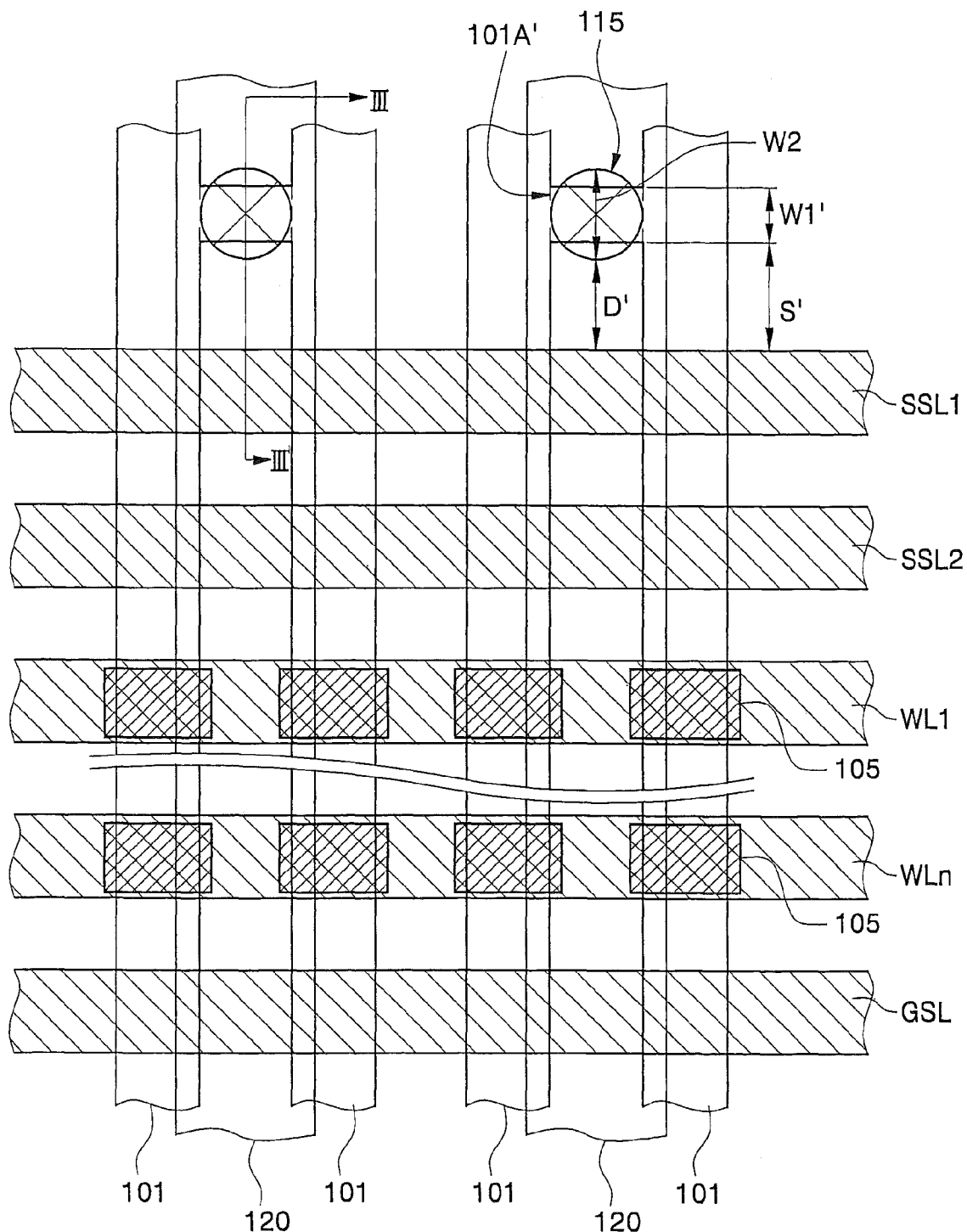
FIG. 5 is a plan view illustrating a portion of a cell array region in a NAND-type flash memory device according to other embodiments of the present invention.
Figure 6:
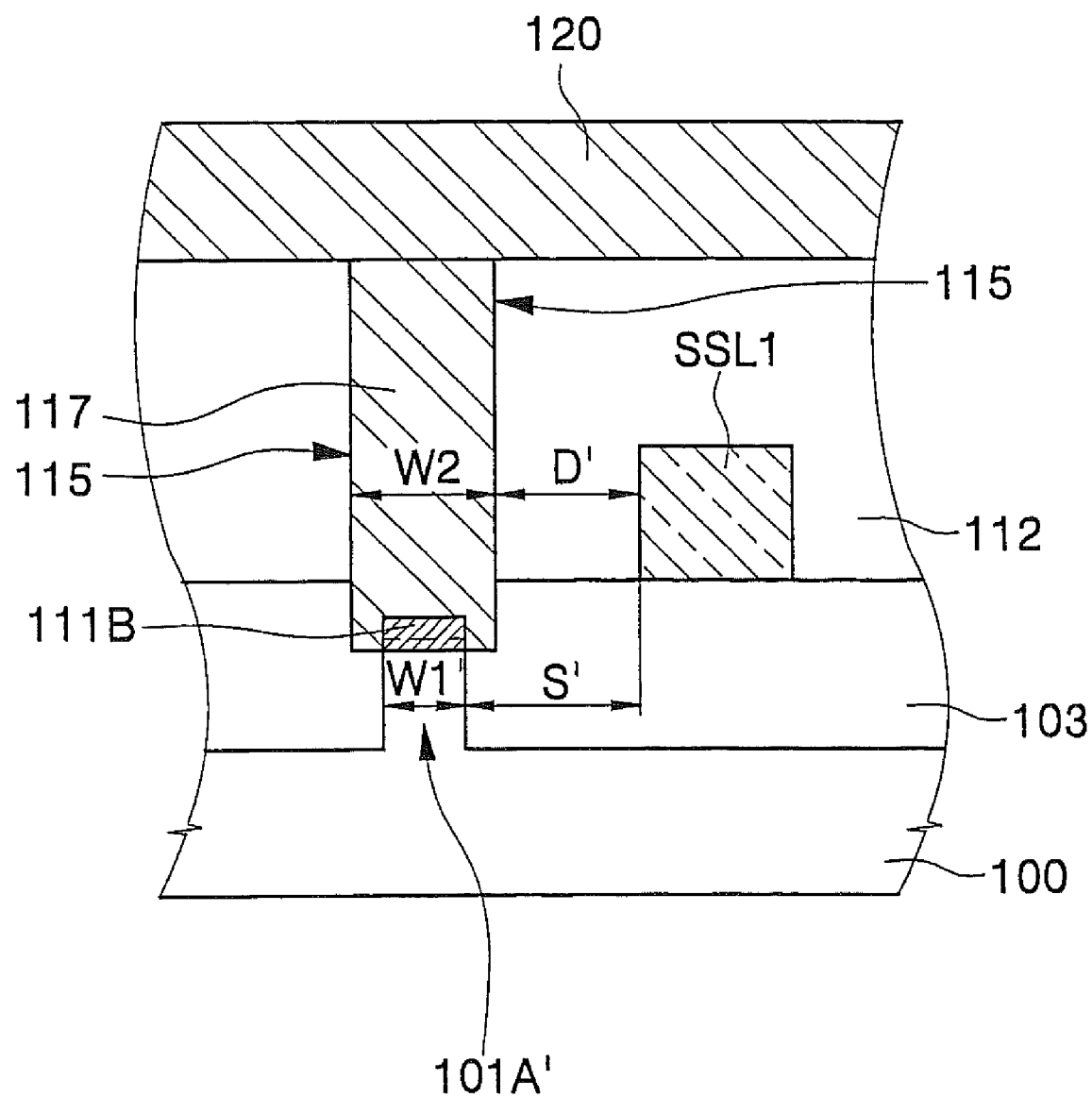
FIG. 6 is a sectional view illustrating a NAND-type flash memory device according to some embodiments of the present invention, as taken along the line III-III' of FIG. 5.

FIG. 5 is a plan view illustrating a portion of a cell array region of a NAND-type flash memory device according to other embodiments of the present invention. FIG. 6 is a sectional view taken along the line III-III' of FIG. 5 to explain NAND-type flash memory devices according to these embodiments of the present invention.

NAND-type flash memory devices according to embodiments of FIGS. 5 and 6 may be different from embodiments of FIGS. 2 through 4, with respect to a contact region structure of the sub active region and the bit line contact plug. The bit line contact region will be specifically described with reference to FIGS. 5 and 6 below.

With reference to FIGS. 5 and 6, an isolation layer 103 is provided at a predetermined region of a semiconductor substrate 100, and the isolation layer 103 defines at least a pair of main active regions 101 and a sub active region 101A, interposed between the pair of main active regions 101, that connects the main active regions 101. The sub active region 101A' has a first width W1'. A first string selection line SSL1 crosses over the main active regions 101 and is positioned adjacent to the sub active region 101A'. In these embodiments, the first width W1' of the sub active region 101A' is less than the first width W1 of FIGS. 2 and 4. As a result, the distance S' between the sub active region 101A' and the first string selection line SSL1 may be greater than the distance S as shown in FIGS. 2 and 4.

An insulating interlayer 112 having a bit line contact hole 115 is provided on the substrate having the first string selection line SSL1. A bit line contact plug 117 is provided in, and in some embodiments filling, the bit line contact hole 115. The bit line contact plug 117 has a second width W2 greater than the first width W1' of the sub active region 101A'. Then, the distance S' between the sub active region 101A' and the first string selection line SSL1 may be greater than the distance D' between the bit line contact plug 117 and the first string selection line SSL1. In addition, the distance S' between the sub active region 101A' and the first string selection line SSL1 may be greater than the first width W1'.

In this case, the bit line contact plug 117 can cover (i.e., extends on) at least one sidewall of the sub active region 101A'. That is, the bit line contact plug 117 can be provided in the region where a part of the isolation layer 103 at both sides of the sub active region 101A' is recessed, as shown in FIG. 6. Therefore, the bit line contact plug 117 may be provided to cover parts of the sidewalls as well as the upper surface of the sub active region 101A'. This can increase the contact area between the bit line contact plug 117 and the sub active region 101A' to decrease the contact resistance of the bit line.

A contact impurity region 111B may be provided in the sub active region 101A' in contact with the bit line contact plug 117. A shared bit line 120 to extend on, and in some embodiments cover, the bit line contact plug 117 and positioned in parallel with the main active regions 101 is provided on the interlayer insulating layer 112.

Methods for fabricating NAND-type flash memory devices, according to some embodiments of the invention, will be described below.

FIGS. 7 through 11 are sectional views taken along the line II-II' of FIG. 2 to explain methods of fabricating NAND-type flash memory devices according to some embodiments of the present invention.

Figure 7:
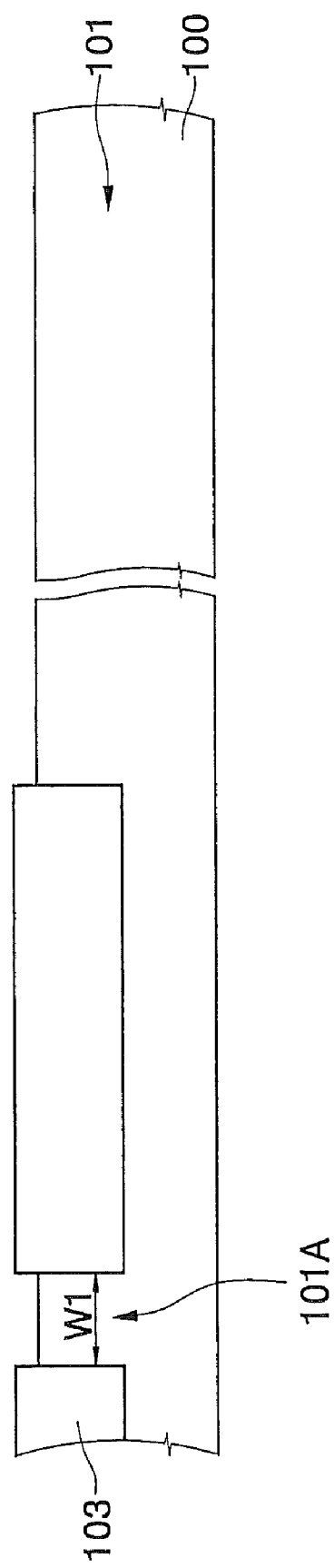
FIGS. 7 through 11 are sectional views explaining methods of fabricating NAND-type flash memory devices according to some embodiments of the present invention, as taken along the line II-II' of FIG. 2.

With reference to FIGS. 2 and 7, an isolation layer 103 is formed at a predetermined region of a semiconductor substrate 100, to define main active regions 101, which are in parallel to each other, and a sub active region 101A, interposed between the main active regions, to contact the main active regions 101. The isolation layer 103 may be formed through an STI (shallow trench isolation) process. The sub active region 101A may have a first width W1.

Figure 8:
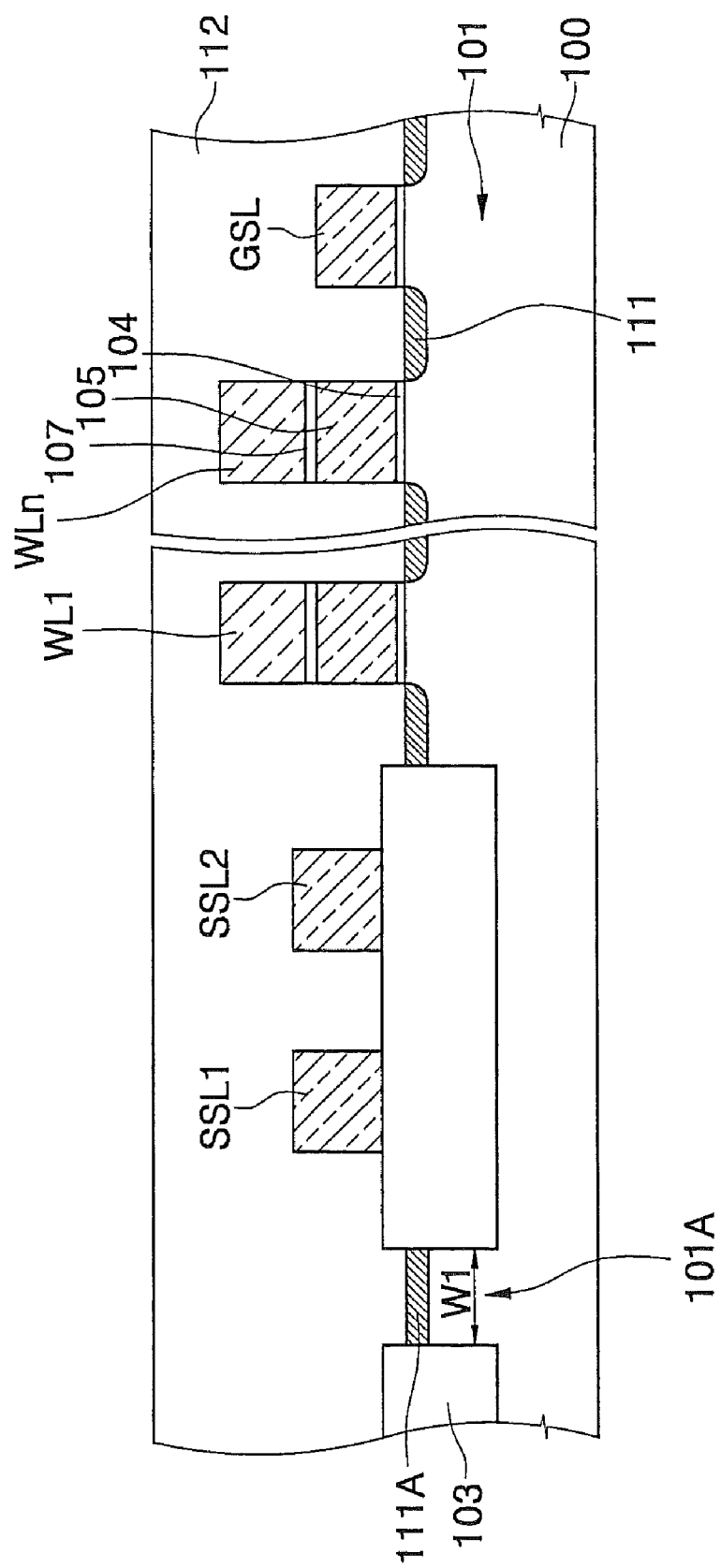

With reference to FIGS. 2 and 8, first and second string selection lines SSL1 and SSL2 and a ground selection line GSL, which cross over the main active regions 101, and n stacked gate patterns disposed between the second string selection line SSL2 and the ground selection line GSL, are formed by general methods known in the art. The stacked gate patterns may be formed to include word lines WL1, ..., WLn which cross over the main active regions 101, and floating gates 105 interposed between the word lines WL1, ..., WLn and the main active regions 101 respectively. The word lines WL1, ..., WLn correspond to control gate electrodes WL1, ..., WLn, respectively. In addition, tunnel insulating layers 104 may be formed between the floating gates 105 and the main active regions 101, and inter-gate dielectric layers 107 may be formed between the control gate electrodes WL1, ..., WLn and the floating gates 105.

Source/drain regions 111 in the main active regions 101 and a shallow impurity region 111A in the sub active region 101A are formed by implanting impurity ions, for example, n-type impurity ions, in the active regions 101 and 101A by using the selection lines SSL1, SSL2 and GSL and the control gate electrodes WL1, ..., WLn as masks for ion implantation. Consequently, the source/drain regions 111 and the shallow impurity region 111A can be formed to have the same depth and the same impurity concentration. An insulating interlayer is formed on the substrate having the source/drain regions 111 and the shallow impurity region 111A.

Figure 9:
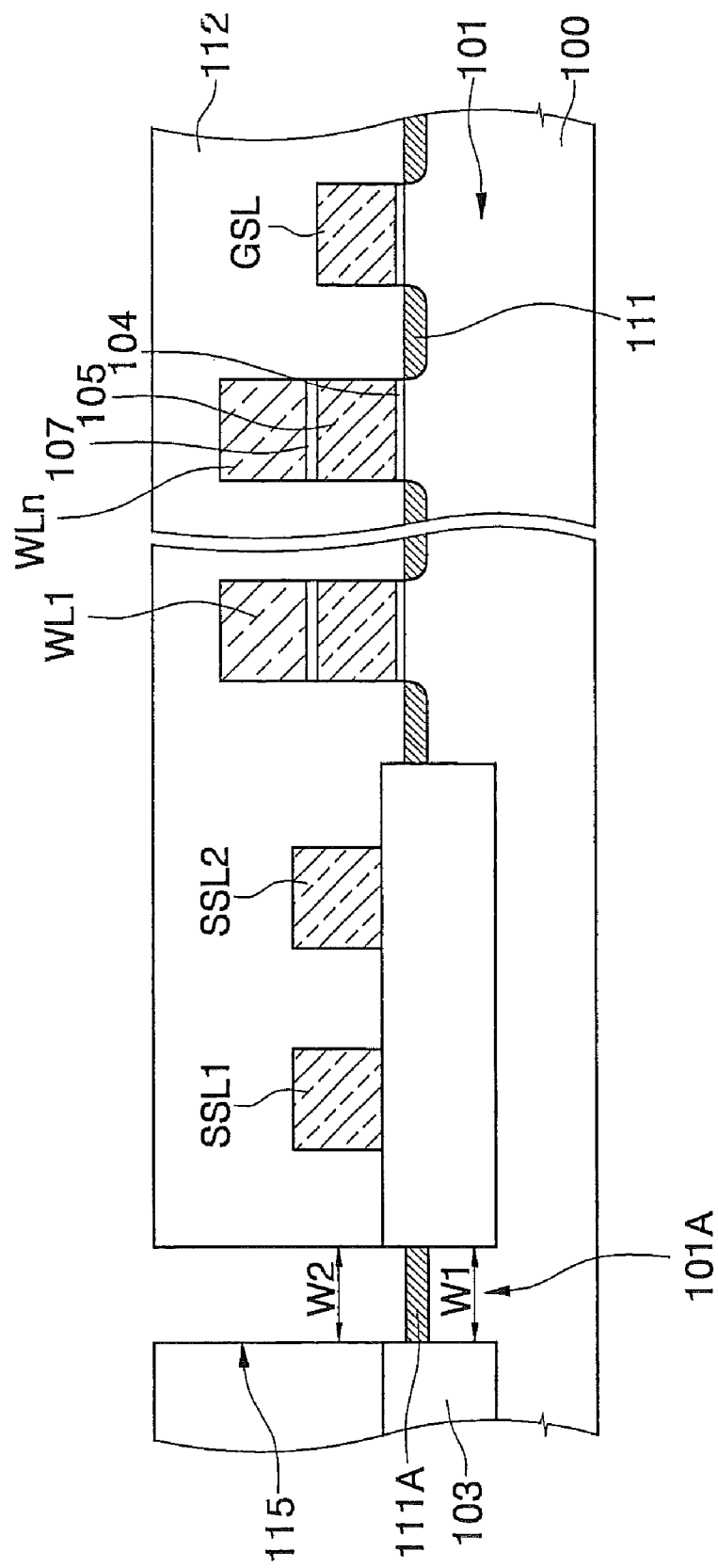

With reference to FIGS. 2 and 9, a bit line contact hole 115 is formed adjacent to the first string selection line SSL1 and exposing the sub active region 101A by patterning the insulating interlayer 112. The bit line contact hole 115 may be formed to have a second width W2 which is the same as or greater than the first width W1. That is, the first width W1 may be less than or the same as the second width W2. FIG. 9 illustrates an embodiment where the second width W2 of the bit line contact hole 115 is formed to be the same as the first width W1. When the second width W2 is formed to be greater than the first width W1, the first width W1 of the sub active region 101A may be formed to be less than the second width W2 in the process of forming the isolation layer 103. When the first width W1 is formed to be less than the second width W2, the isolation layer 103 at both sides of the sub active region 101A can be recessed to expose the sidewalls of the sub active region 101A during the forming of the bit line contact hole 115.

Figure 10:
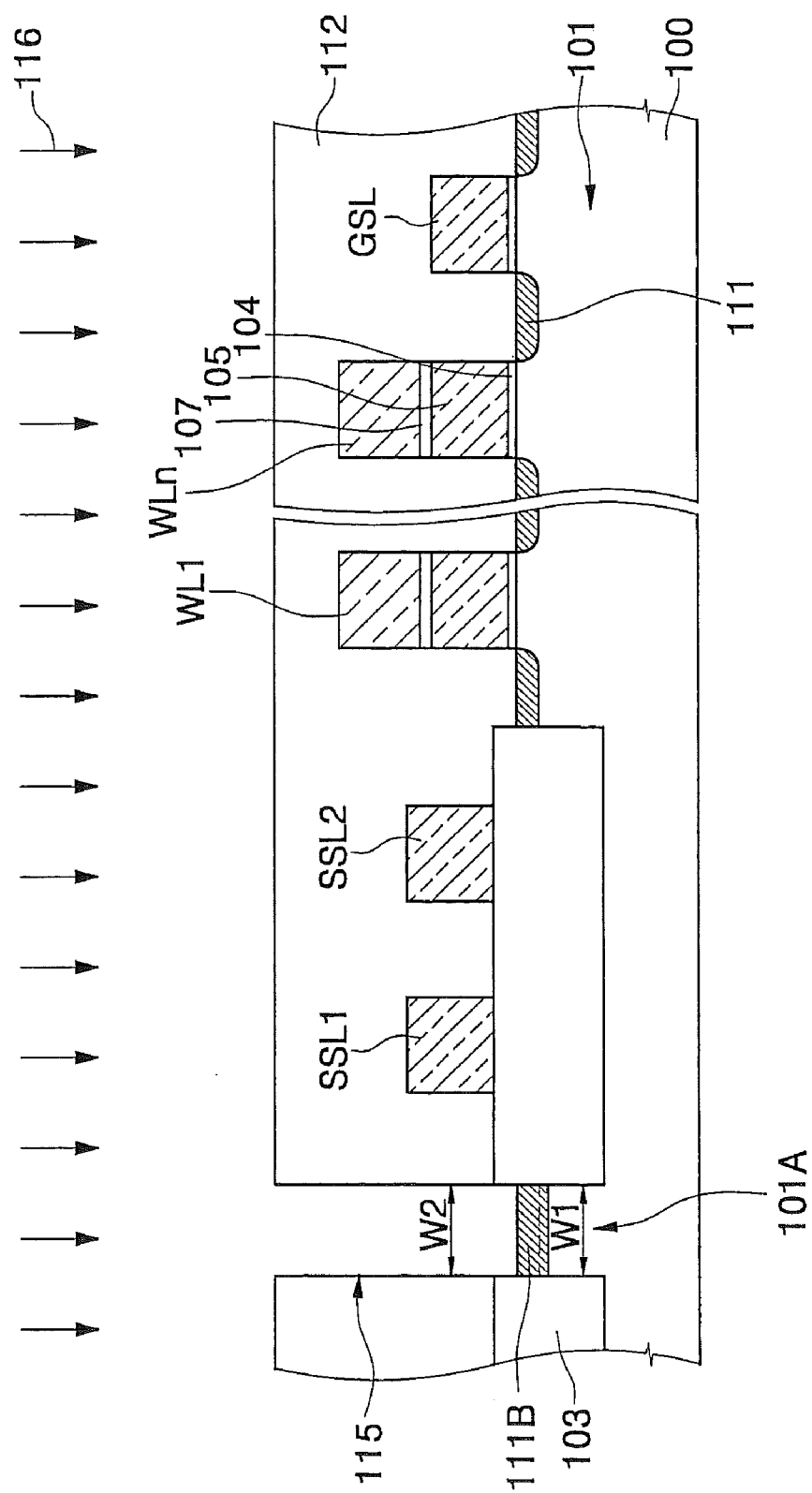

With reference to FIGS. 2 and 10, it is possible to ion-implant impurities 116 in the sub active region 101A by using the insulating interlayer 112 having the bit line contact hole 115 as a mask for ion implantation. The impurities 116 may be n-type impurities. The n-type impurities may be P (phosphorous) or As (arsenic), and these can be ion-implanted at a dose of about $1\times10^{15}$ atom/cm$^2$ or more. Thus, a contact impurity region 111B is formed in the sub active region 101A. As shown, the contact impurity region 111B may be formed to be deeper than the source/drain regions 111. Further, the contact impurity region 111B may be formed to have a higher impurity concentration than that of the source/drain regions 111.

Figure 11:
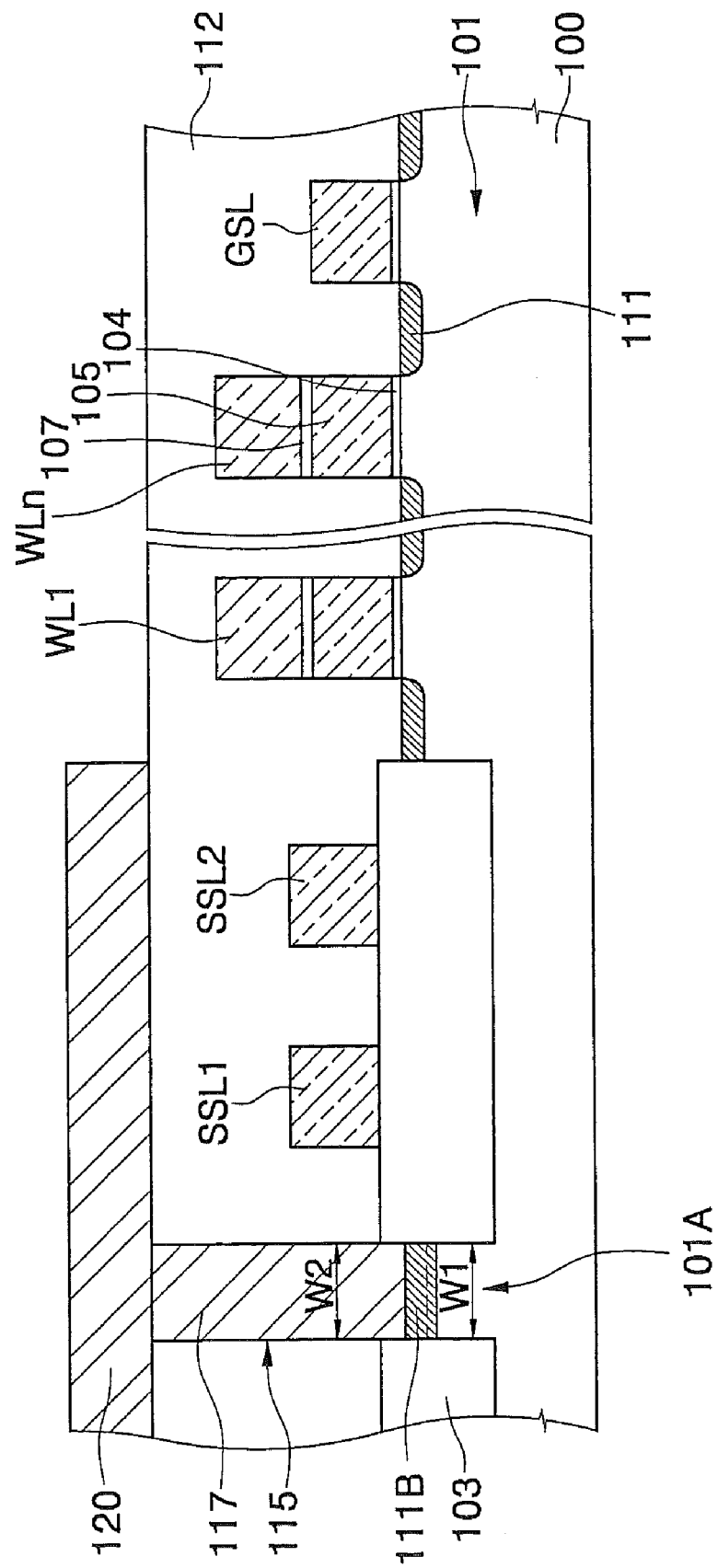

With reference to FIGS. 2 and 11, a bit line conductive layer, such as a doped semiconductor layer and/or a metal layer, is formed on the substrate having the bit line contact hole 115, and the upper surface of the insulating interlayer 112 is exposed by planarizing the bit line conductive layer by chemical/mechanical polishing techniques and/or etch-back techniques. As a result, a bit line contact plug 117 is formed in the bit line contact hole 115. The bit line contact plug 117 may be a doped polysilicon plug, a tungsten plug and/or may comprise other materials.

A shared bit line 120 covering the bit line contact plug 117 and being positioned in parallel to the main active regions 101 is formed on the insulating interlayer 112. The shared bit line 120 is electrically connected with the sub active region 101A through the bit line contact plug 117. As the sub active region 101A is connected with the main active regions 101, the shared bit line 120 electrically comes into contact with a pair of the main active regions 101.

According to some embodiments of the present invention as described above, the width of the bit line contact plug can be the same as or greater than the width of the active region contacting with the bit line contact plug. Thus, the distance between the selection line disposed to be adjacent to the bit line contact plug and the active regions can be increased, so that it is possible to form an electrically stable selection line. Further, the contact resistance of the bit line may not increase.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method for fabricating a memory device comprising:
   forming an isolation layer in a semiconductor substrate to define active regions, the active regions including a pair of closely spaced-apart active regions in parallel with each other;
   forming a plurality of gate patterns crossing the active regions, each gate pattern having a gate electrode crossing the active regions;
   forming an insulating interlayer on the semiconductor substrate;
   forming a bit line contact hole exposing the active regions by patterning the insulating interlayer, the active region(s) having a first width and the bit line contact hole having a second width in a bottom portion;
   forming a bit line contact plug in the bit line contact hole; and
   forming a shared bit line on the bit line contact plug and on the insulating interlayer;
   wherein, when the second width is greater than the first width, the isolation layer adjacent to the active regions is recessed to expose both sidewalls of the active regions during forming the bit line contact hole.

2. The method according to claim 1, wherein the bit line contact plug extends on at least one sidewall of the active region.

3. The method according to claim 2, wherein the bit line contact plug surrounds both the sidewalls of the active region.

4. The method according to claim 1, wherein a bottom of the bit line contact hole exposes the isolation layer.

5. The method according to claim 1, wherein the bit line contact hole exposes at least one sidewall of the isolation layer.

6. The method according to claim 1, wherein the bit line contact hole exposes at least one sidewall of the active region.

7. A method for fabricating a memory device comprising:
   forming an isolation layer in a semiconductor substrate to define an active region, the active region having two side active regions and one central active region between the two side active regions, wherein both the side active regions are electrically connected with the central active region;
   forming an insulating interlayer on the semiconductor substrate and the isolation layer;
   forming a bit line contact hole exposing a top surface of the central active region,
   forming a bit line contact plug in the bit line contact hole to be in contact with the top surface of the central active region;
   and forming a shared bit line on the bit line contact plug and the insulating interlayer;
   wherein the bit line contact plug is in contact with at least one sidewall of the central active region.

8. The method according to claim 7, wherein the bit line contact plug is in contact with at least two sidewalls of the central active region.

9. The method according to claim 7, wherein the bit line contact plug has at least one extending bottom portion in contact with the isolation layer.

10. The method according to claim 9, wherein the bit line contact plug has at least two extending bottom portions in contact with the isolation layer.

11. A method for fabricating a memory device comprising:
    forming an isolation layer in a semiconductor substrate to define an active region, the active region having two side regions and a central region being electrically connected with each other;

forming a plurality of gate patterns crossing the active region and the isolation layer;

forming an insulating interlayer on the semiconductor substrate and the isolation layer;

forming a bit line contact plug penetrating the insulating interlayer to be in contact with a top surface of the central region, wherein the top surface of the central region has a first width and the bit line contact plug has a second width in a bottom portion thereof that is different from the first width; and forming a shared bit line on the bit line contact plug and the insulating interlayer.

12. The method according to claim 11, wherein a bottom of the bit line contact plug is lower than the top surface of the central region.

13. The method according to claim 12, wherein the bit line contact plug is in contact with at least one sidewall of the central region.

14. The method according to claim 12, wherein the bit line contact plug is in contact with at least one sidewall of the isolation layer.

15. The method according to claim 14, wherein a bottom of the bit line contact plug is in contact with the isolation layer.

* * * * *